United States Patent [19]

Bartram et al.

[11] 4,045,716

[45] Aug. 30, 1977

[54] MAGNETIC FIELD SYSTEMS EMPLOYING A SUPERCONDUCTING D.C. FIELD COIL

[76] Inventors: Trevor Carlisle Bartram, Fossway, Newcastle upon Tyne NE6 2YD; Paul Alexander Hazell, Ministry of Defence (Navy), D.G. Ships, Foxhill, Bath, Somerset, both of England

[21] Appl. No.: 577,506

[22] Filed: May 14, 1975

Related U.S. Application Data

[63] Continuation-in-part of Ser. No. 398,359, Sept. 18, 1973, abandoned.

[51] Int. Cl.$^2$ .......................... H02P 7/34; H02J 15/00
[52] U.S. Cl. ...................................... 318/154; 361/141; 363/27
[58] Field of Search .................. 322/16; 318/153, 154; 323/44 F; 321/8 CD, 2; 317/123, DIG. 6

[56] References Cited

U.S. PATENT DOCUMENTS

| 2,604,616 | 7/1952 | Edwards | 318/154 |
| 2,929,975 | 3/1960 | Caldwell et al. | 318/154 |
| 3,263,142 | 7/1966 | Adoutte et al. | 318/154 |
| 3,450,952 | 6/1969 | Nelson | 317/123 |
| 3,864,965 | 2/1975 | Anderson | 318/154 |

*Primary Examiner*—William H. Beha, Jr.
*Attorney, Agent, or Firm*—Lawrence Rosen; E. Janet Berry

[57] ABSTRACT

Method and equipment for transferring energy to or from a direct-current superconducting field coil to change the magnetic field generated by the coil in which a second direct-current superconducting coil is used as a storage coil, and energy transfer between the field coil and the storage coil is effected automatically in dependence upon a control programe. Preferably, the control programe acts upon a variable transformer which is coupled by respective rectifier/inverters to the field and storage coils and also serves for initial supply of energy to the coils.

12 Claims, 11 Drawing Figures

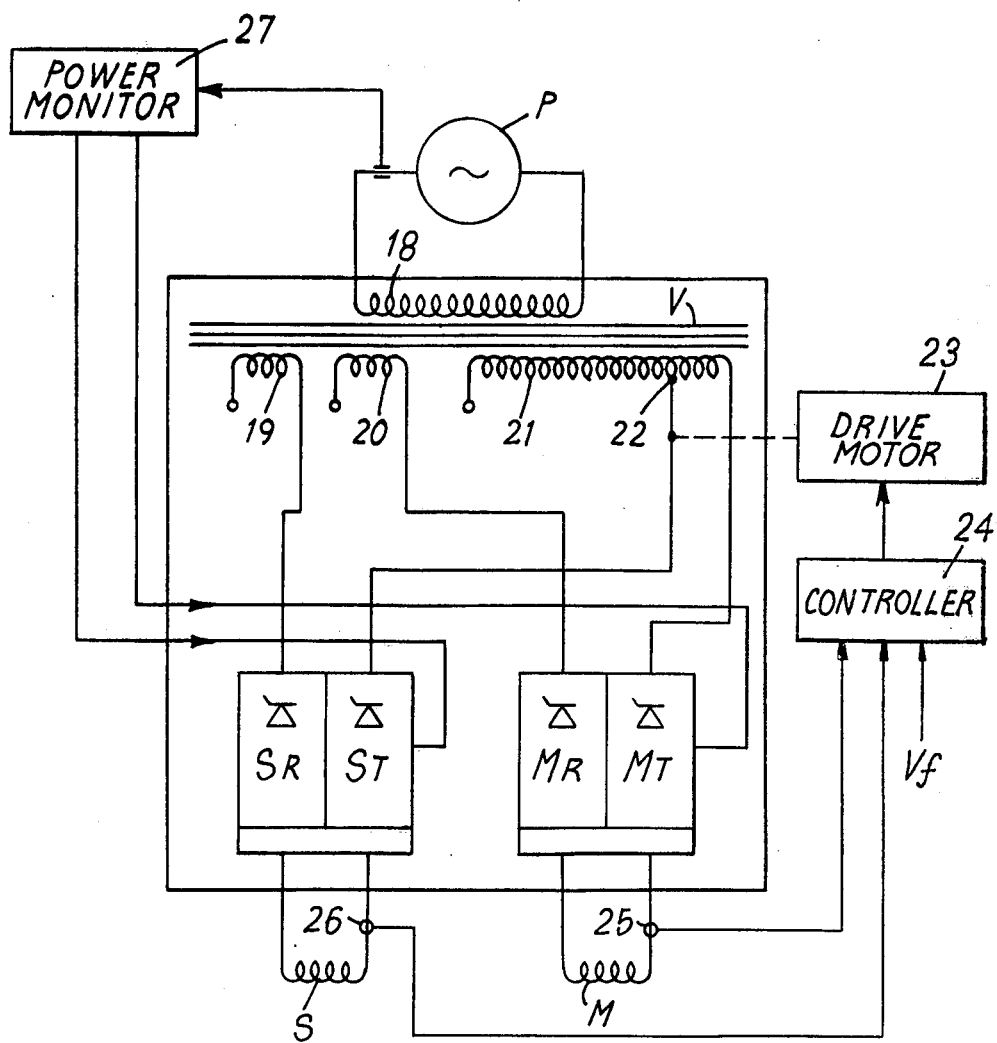

$$V_S = \frac{i_f V_f}{i_S}$$

MAGNETIC FIELD SYSTEMS EMPLOYING A SUPERCONDUCTING D.C. FIELD COIL

This application is a continuation-in-part of our application Ser. No 398,359, filed Sept. 18, 1973, now abandoned.

BACKGROUND OF THE INVENTION

The present invention relates to the transfer of energy to or from a direct-current superconducting field coil to change the magnetic field produced by the coil.

Recent developments in the practical application of superconductivity have led to the use of d.c. superconducting coils for such purposes as dynamo-electric machine field producing coils and plasma containment magnet coils. In most applications of this type the stored energy in the magnetic field produced by a superconducting coil is of considerable magnitude, giving rise to problems of energy transfer and disposal when it is required to vary, remove, or reverse the magnetic field.

BRIEF SUMMARY OF THE INVENTION

In accordance with the present invention there is provided a method of transferring energy to or from a direct-current superconducting field coil to change the magnetic field produced by the coil comprising, providing a storage coil which is a direct-current superconducting coil generating a magnetic field when energized and transferring energy between the field coil and the storage coil by way of an energy transfer device in accordance with a control program based on electrical parameters of the two coils.

There is also provided equipment for transferring energy to or from a direct-current superconducting field coil to change the magnetic field produced by the coil comprising a storage coil which is a direct-current superconducting coil generating a magnetic field when energized, controllable electrical energy transfer means coupled between said field coil and said storage coil, and control means connected to said transfer means to control the rate of energy transfer between said field coil and said storage coil in accordance with a predetermined program.

The transfer means may also serve for the supply of power to the coils from a power source, especially for initial energization of the coils, and in this case the transfer means are adjusted during an energy transfer operation to minimize power flow from the source. The rate of electrical energy transfer from one coil to the energy transfer means must be substantially equal to the rate of energy transfer from the transfer means to the other coil at all times. That is to say the total energy stored in the two coils remains constant throughout the energy transfer operation.

The energy transfer means may comprise alternating current devices requiring that both active and reactive power from an alternating current power source are minimized. In alternative arrangements, however, the energy transfer means may comprise direct current devices, for example direct-coupled rotary d.c. machines, in which case control to minimize direct power only to the energy transfer means is required.

The energy transfer means preferably comprises a rectifier/inverter for each coil, there being a controlled variable ratio transformer coupling between the two rectifier/inverters. Adjustment of the firing angles of rectifying devices in the rectifier/inverters prior to and, if required, during an energy transfer period governs the required conditions for initiating energy transfer and maintaining balance of electrical power transfer rate between each coil and the energy transfer means, while transfer of energy is initiated and controlled by the variable ratio transformer coupling arrangement between the two rectifier/inverters.

The variable coupling arrangement may be formed by secondary windings on a transformer, the primary winding of which is connected to the electrical power source. The variable ratio coupling may be adjusted by an induction regulator of the rolling contact type and the transformer may be arranged as an auto-transformer.

In alternative systems, a fixed ratio coupling between rectifier/inverters of the energy transfer means could be adopted if their firing angles were controlled to draw reactive power from the power source and such reactive power flow was acceptable in the system.

The invention may be applied in a system basically requiring only a single superconducting d.c. coil, for example, in a plasma confining magnetic field coil arrangement for power generation, in which case the storage coil is essentially an auxiliary item.

In the preferred embodiment the invention provides a system for controlling an electric motor drive in which the motor is of the homopolar type having a superconducting field winding and is part of a motor-generator set in which the generator is also of the homopolar type having a superconducting field winding. Speed control of the motor is effected by field control of the generator in this system and the superconducting field coil of the generator either receives energy from or transmits energy to the motor field coil according to the required drive operation, the motor field coil thus also serving as a storage coil for the generator coil. The generator may be driven by a prime mover which also drives an a.c. exciter acting as a power source for the generator and motor field windings. Alternatively, a separately available a.c. supply may be used. This type of system is particularly suitable for marine propulsion and in such an application the vessel's auxiliary a.c. generating supply may satisfy the a.c. supply requirement of the system.

BRIEF DESCRIPTION OF THE DRAWINGS

The scope and nature of the invention will now further be made clear by the following description with reference to the accompanying drawings, of which:

FIG. 3 shows a simplified circuit diagram of apparatus comprising energy transfer means for the machine field coils of the system shown in FIG. 2;

DETAILED DESCRIPTION OF THE INVENTION

Figure 1:
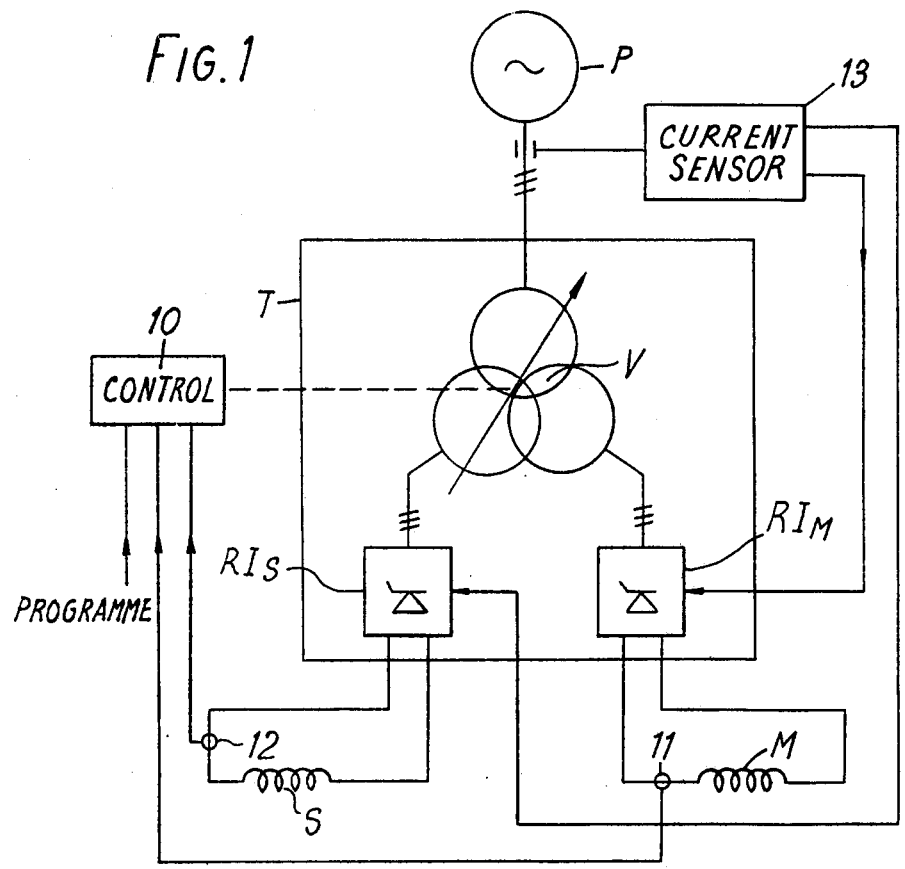
FIG. 1 shows a basic circuit diagram for an energy transfer system between two superconducting d.c. coils according to one aspect of the invention.

In the system shown in FIG. 1, M is a main superconducting direct-current field coil and S is a storage coil which is also a superconducting direct-current field coil. The coils M and S are coupled by an energy transfer system T which also serves to connect a power source P to the coils. The source P is in this case a three phase alternating current supply.

The operation of the energy transfer system T to transfer energy between the coils M and S is controlled by a control device 10 which operates in accordance with a predetermined program. As will be shown mathematically below, this program is dependent on the initial states of the two coils. Current sensors 11 and 12 associated with the coils M and S, respectively, feed the required electrical parameters to the control device 10.

Thus, if it is required for example to reduce the magnetic field of the coil M from a maximum value to zero, the initial voltage, current and stored energy conditions for coil M will be known as will the desired final values of these parameters. The corresponding values of the initial and final parameters of coil S are also known. Hence it is possible to calculate the intermediate values of these parameters at any time during the period of energy transfer between coils M and S for a desired transfer mode (for example, linear rate of decrease of current in coil M) for the condition that, at all times during the period, the rate of energy transfer from coil M is substantially equal to the rate of energy transfer to coil S via the energy transfer means T, and to apply a control program within the means T based on the calculated results.

As indicated in FIG. 1, the energy transfer means T preferably comprises a rectifier/inverter $RI_S$ associated with coil S and a similar rectifier inverter $RI_M$ associated with coil M, together with a variable ratio transformer V interconnecting the a.c. sides of the two rectifier inverters. The control device 10 is arranged to control the transformer V to vary the coupling between the a.c. sides of the rectifier/inverters $RI_S$ and $RI_M$ at the transformer. The mode of operation of each rectifier/inverter, that is to say rectifying or inverting mode, may be initially set by the control program to ensure the required direction of energy transfer.

The a.c. power source P is connected to a primary winding of the transformer V and in addition to providing initial energization of either coil S or coil M it acts as the frequency control for the inverters of rectifier/inverters $RI_S$ and $RI_M$. Since the control effected by the control device 10 may not be sufficiently accurate to maintain the energy transfer rates between the coils M and S and the transfer system T in balance, the firing angles of the rectifier/inverters $RI_S$ and $RI_M$ are controlled by a current sensor 13 responsive to current flow between the source P and the transfer system T to minimize such current flow and thereby minimize supply of power by the source P during an energy transfer operation.

In an alternative embodiment of the invention which is not shown in the drawings, the connection of the transformer V to the two rectifier/inverters is by a fixed ratio coupling. Control of the energy transfer system T is effected solely by varying the firing angles of the rectifier devices in the rectifier/inverters using the control device to effect such control. The current may provide an additional input to the control device but current is allowed to flow in the connections between the source P and the transformer V to permit the transfer of reactive power only between the two.

Figure 2:
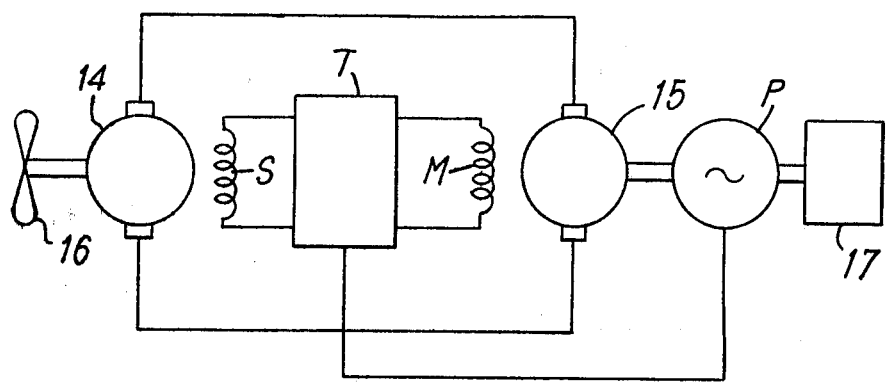
FIG. 2 shows a schematic diagram of a motor drive system in accordance with the preferred embodiment of the invention.

Referring to FIG. 2, the drive system shown is one intended for marine propulsion and consists principally of a motor-generator set comprising a motor 14 and a generator 15 providing a continuously variable speed drive for a propeller 16. The drive system is basically powered by a prime mover 17 which may have any power/speed characteristic.

Motor 14 and generator 15 are both homopolar machines of the type having a superconducting d.c. field coil, coil M being the field coil for generator 15 while coil S is the field coil for motor 14. Speed control of motor 14 is effected by varying the ratio of the field current of generator 15 to the field current of motor 14, for any generator speed, such that the total magnetic stored energy of the motor and generator field coils remains substantially constant.

The resultant stored magnetic energy variations in the generator field coil M are accommodated by energy transfer between the coil M and the motor field coil S, in accordance with the invention, the transfer being effected via the energy transfer means T.

In a preferred system of the type shown in FIG. 2, the nominal stored energy capacity of the motor field coil S may exceed that of the generator field coil M by a factor of three, or greater. It is thus possible to charge the motor field coil S initially, prior to operation of the system, from an exciter power source P of comparatively low power as compared with the system power, this initial charging being permitted to take place over a substantial time period as compared to the short time periods required for energy transfer between coils S and M which the drive is in operation. Hence it is possible to dispense with the provision of a large, highly rated, generator for field coil M, resulting in substantial space and weight saving in a marine vessel. In many cases the power source P may be derived from conventionally specified auxiliary generators for a vessel, dispensing with the requirement for a separate exciter for the motor-generator drive system.

The energy transfer means T is preferably arranged on the general lines of the circuit diagram shown in FIG. 3. Each field coil has a high voltage silicon controlled rectifier (SCR) bridge for use during energy transfer and a low voltage SCR bridge for use during steady running. The generator high voltage bridge is designated $M_T$ and the low voltage bridge $M_R$ in FIG. 3, while the corresponding motor bridges are designated $S_T$ and $S_R$.

For simplicity, the alternating current section of the circuit is shown as single-phase in FIG. 3, but in practice it would preferably be three-phase. This section comprises a transformer V with a primary coil 18 fed from the a.c. exciter source P, secondary windings 19 and 20 respectively supplying bridges $S_R$ and $M_R$ and an auto-transformer secondary winding 21 connected to the high voltage bridges $S_T$ and $M_T$ as shown. The connection to the motor field coil high voltage bridge $S_T$ is preferably made by way of a rolling contact 22 of the Brentford Regulator type on the auto-transformer winding 21.

The contact 22 is moved by a drive motor 23 under the control of a controller 24 which receives a program input and also an initial condition input from one of two sensors 25 and 26 associated with the coils M and S respectively. As in the embodiment of FIG. 1, a power monitor 27 acting to control the firing angles of the rectifiers $S_T$ and $M_T$ serves to maintain minimum power transfer between the source P and the transformer V.

The operation of the drive system shown in FIGS. 2 and 3 will now be described for a speed change from maximum speed to zero requiring a reduction of motor armature current from maximum to zero, by way of explanation of the system control.

The initial conditions of the generator field coil for the operation to be described are that its field current is at maximum value and the stored magnetic energy of the field coil is also at maximum value. The voltage across the generator field coil is required to be constant throughout the operation. At the end of the operation the current in the generator field coil is required to be zero, when the stored energy in the generator field coil must also be zero, and thus the maximum stored energy in the generator field coil must be transferred to the motor field coil during the operation.

The initial conditions of the motor field coil for the operation under consideration are that its field current is initially at a base maximum value for motor field requirements but that its stored magnetic energy at this current value is at considerably less than the maximum value, since the stored energy capacity of the motor field coil must be great enough to accept also the energy to be transferred to it from the generator field coil.

Referring to FIGS. 4a–4c and 5a–5c, the behavior of the system for the operation may be considered mathematically using the following symbols for the system parameters:

$i_f$ = instantaneous generator field coil current
$I_f$ = maximum generator field coil current
$v_f$ = instantaneous generator field coil voltage
$V_f$ = maximum generator field coil voltage
$e_f$ = instantaneous stored energy of generator field coil
$E_{f_o}$ = initial stored energy of generator field coil
$E_{f_1}$ = final stored energy of generator field coil
$P_f$ = instantaneous rate of flow of energy from generator field coil (power)
$L_f$ = generator field coil inductance
$i_s$ = instananeous motor field coil current
$I_{s_o}$ = initial (base) motor field coil current
$I_{s_1}$ = final motor field coil current
$v_s$ = instantaneous motor field coil voltage
$V_s$ = initial motor field coil voltage
$e_s$ = instantaneous stored energy of motor field coil
$E_{s_o}$ = initial stored energy of motor field coil
$E_{s_1}$ = final stored energy of motor field coil
$p_s$ = instantaneous rate of flow of energy to motor field coil
$L_s$ = motor field coil inductance The transfer of energy from the generator field coil to the motor field coil is considered to take place over a period $T_f$ during which a linear rate of decrease of current in the generator field coil is stipulated while the generator field coil voltage is maintained constant. In a typical system the maximum stored energy of the motor field coil may be a factor three times greater than that of the generator field coil.

Assuming no energy is drawn into the system from the source during the operation, the total energy of the system at any time equals the initial total energy:

Total Energy = Motor Field coil energy + Generator field coil energy (1)

$$B = E_{so} + E_{fo}$$

$$B = \tfrac{1}{2} L_s I_{so}^2 + \tfrac{1}{2} L_f I_f^2$$

During generator field coil discharge $$v_f = -L_f \frac{di_f}{dt} = V_f, \text{ since } v_f \text{ maintained constant of maximum value}$$

$$\therefore \frac{di_f}{dt} = -\frac{V_f}{L_f}$$

Integrating, $$i_f = -\frac{V_f}{L_f} t + C_1 \qquad (2)$$

Since, at $t = 0$, $i_f = I_f$, then $C_1 = I_f$
Substituting for $C_1$ in (2), $$i_f = I_f - \frac{V_f}{L_f} t, \text{ a linear expression} \qquad (3)$$

At end of operation $t = T_f$ and $i_f = 0$, $$\therefore T_f = \frac{L_f}{V_f} I_f, \text{ from (3)}$$

At any instant total energy $$B = \tfrac{1}{2} L_s i_s^2 + \tfrac{1}{2} L_f i_f^2$$

∴ from (1), $$\tfrac{1}{2} L_s i_s^2 + \tfrac{1}{2} L_f i_f^2 = \tfrac{1}{2} L_s I_{so}^2 + \tfrac{1}{2} L_f I_f^2$$

$$L_s(i_s^2 - I_{so}^2) = L_f(I_f^2 - i_f^2)$$

$$= L_f[I_f^2 - (I_f - \frac{V_f}{L_f} t)^2], \text{ from (3)}$$

$$i_s^2 - I_{so}^2 = \frac{L_f}{L_s}\left[2\frac{V_f I_f}{L_f} t - \frac{V_f^2 t^2}{L_f^2}\right]$$

$$= \frac{L_f}{L_s} \cdot \frac{V_f I_f}{L_f}\left[2 - \frac{V_f}{L_f I_f} t\right]$$

$$\therefore i_s^2 = \frac{V_f I_f}{L_s}\left[2 - \frac{V_f}{L_f I_f} t\right] t + I_{so}^2 \qquad (4)$$

At $t = T_f = \frac{L_f}{V_f} I_f$, $$I_{s_1}^2 = \frac{V_f I_f}{L_s}\left[2 - \frac{V_f}{L_f I_f} \cdot \frac{L_f I_f}{V_f}\right] \frac{L_f I_f}{V_f} + I_{so}^2$$

$$\therefore I_{s_1}^2 = \frac{L_f}{L_s} I_f^2 + I_{so}^2 \qquad (5)$$

Now $v_s = L_s \frac{di_s}{dt}$, and (6)

Differentiating (4)

2 is $\frac{di_s}{dt} = 2\frac{V_f I_f}{L_s} - \frac{V_f I_f}{L_s} \frac{V_f}{L_f I_f} 2t$ $\therefore$ is $\frac{di_s}{dt} = \frac{V_f I_f}{L_s}\left[1 - \frac{V_f}{L_f I_f} t\right]$ (7)

Substituting for $\frac{di_s}{dt}$ in (6) from (7), $v_s = Ls\frac{di_s}{dt} = \frac{L_s}{i_s} \frac{V_f I_f}{L_s}\left[1 - \frac{V_f}{L_f I_f} t\right]$ $\therefore v_s = \frac{V_f I_f}{i_s}\left[1 - \frac{V_f}{L_f I_f} t\right]$ (8)

Verification of the expressions (4) and (8) may be made by considering the power equation:

$i_s v_s = i_f v_f$ at all times or $i_s v_s = i_f V_f$ in present example (9)

Thus, is $v_s = i_s L_s \frac{di_s}{dt}$ $= L_s \frac{V_f I_f}{L_s}\left[1 - \frac{V_f}{L_f I_f} t\right]$, from (7)

$= V_f I_f - V_f \frac{V_f}{L_f} t$ (10)

From (3) $I_f = i_f + \frac{V_f}{L_f} t$ $\therefore V_f I_f = i_f V_f + V_f \frac{V_f}{L_f} t$ Subst. for $V_f I_f$ in (10)

$i_s v_s = i_f V_f + V_f \frac{V_f}{L_f} t - \frac{V_f V_f}{L_f} t$ $\therefore i_s v_s = i_f V_f$ It will be understood that from the expression for instantaneous voltage $v_s$, (8), control of movement of the rolling contact 22 in FIG. 3 in accordance with the required value of $v_s$ for energy transfer under the prescribed conditions may be effected.

Thus, for the operation considered, rolling contact 22 would initially be set at the extreme right-hand side of winding 21, where $v_s = V_s$. The firing angles of the rectifiers in bridge $M_T$ are arranged to set the bridge at full invert throughout the operation, while those in bridge $S_T$ are arranged to set the bridge at full rectify throughout the operation.

Contact 22 would next be moved according to the required control function to effect the required energy transfer. Movement of contact 22 may be made sufficiently accurately with unsophisticated control function generating means, in which case the rectifier firing angles are not adjusted during the operation. Should such means not adequately balance the power transfer rates at all times, however, small variations of the firing angles of the rectifiers in bridges $M_T$ and $S_T$ may be made under the control of the detector 27 monitoring power supply from the source P, in such a way that any power flow, either direct or reactive, is minimized.

Generator field coil current is thus reduced from maximum value to zero by transferring the power flowing from the generator field coil due to its reducing d.c. current as a.c. power after inversion in the energy transfer means, the a.c. power being transferred to the motor field coil by rectification to produce increased d.c. current in the motor field coil.

Figure 4A:
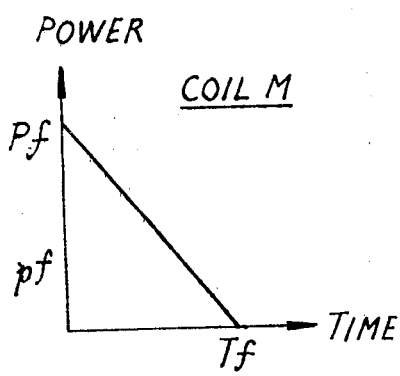
FIGS. 4a – 4c show the generator field coil electrical parameters for the system shown in FIG. 2 during a discharge of the generator field into the motor field.
Figure 5A:
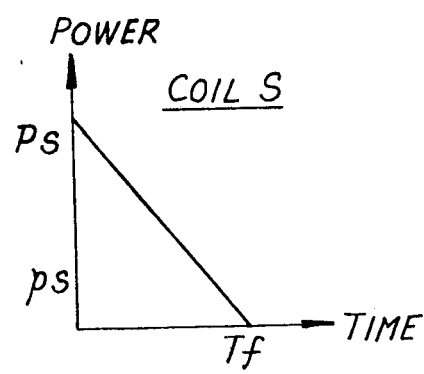
FIGS. 5a – 5c show corresponding required motor field parameters for the system shown in FIG. 2 to the generator parameters shown in FIGS. 4a–4c for the discharge of the generator field into the motor field.
Figure 4B:
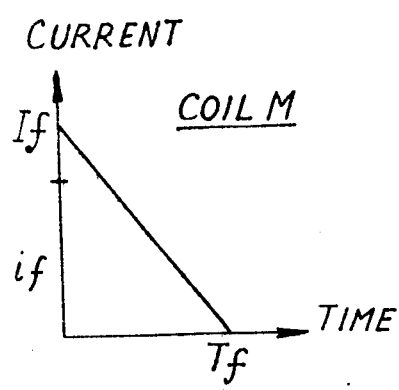
Figure 4C:
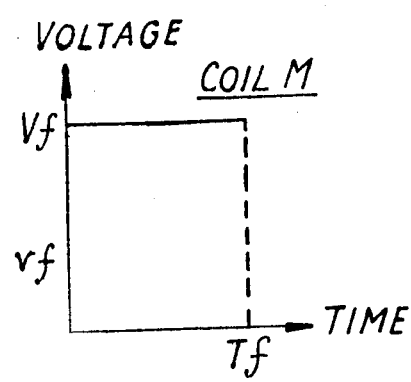
Figure 5C:
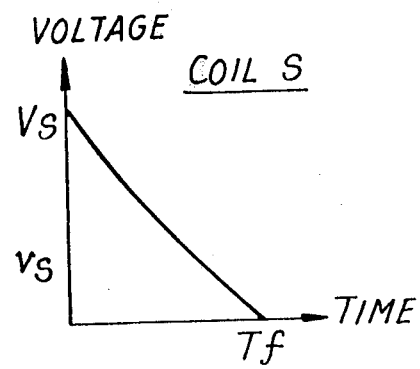

Referring to the graphs shown in the Figures, the constant generator field coil voltage characteristic, FIG. 4c, and the rectilinear generator field coil current characteristic, FIG. 4b, correspond to the rectilinear generator field coil power characteristic, FIG. 4a. The latter characteristic must match exactly the motor field coil power characteristic, FIG. 5a. The curvilinear characteristics of motor field coil current, FIG. 5b, and voltage, FIG. 5c, correspond to the expressions (4) and (8), their product corresponding to the power characteristic, FIG. 5a.

Figure 5B:
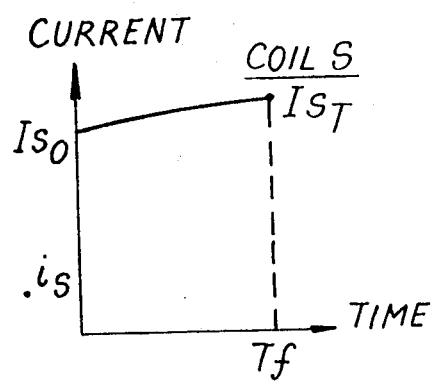

From the current characteristic of FIG. 5b it will be noted that the final motor field coil current $I_{s_f}$ is greater than its initial value $I_{s_o}$, corresponding with expression (5) given earlier:

$$Is_f^2 = \frac{L_f}{Ls} L_f^2 + Is_o^2$$

Thus, the final energy of the motor field coil $$E_{sf} = \frac{1}{2} Ls\, Is_f^2 = \frac{1}{2} L_s \frac{L_f}{Ls} I_f^2 + \frac{1}{2} L_s I_{so}^2$$

$$= \frac{1}{2} L_f I_f^2 + \frac{1}{2} L_s I_{so}^2$$

i.e. the sum of the initial generator field coil energy and the initial motor field coil energy.

The energy transfer means need not necessarily comprise an a.c. power transfer arrangement coupled with rectifier inverters. In an alternative form of the invention, schematically indicated in FIG. 6, two direct shaft-coupled d.c. electrical machines, each capable of motor/generator operation, are used for energy transfer in energy transfer means T.

Figure 6:
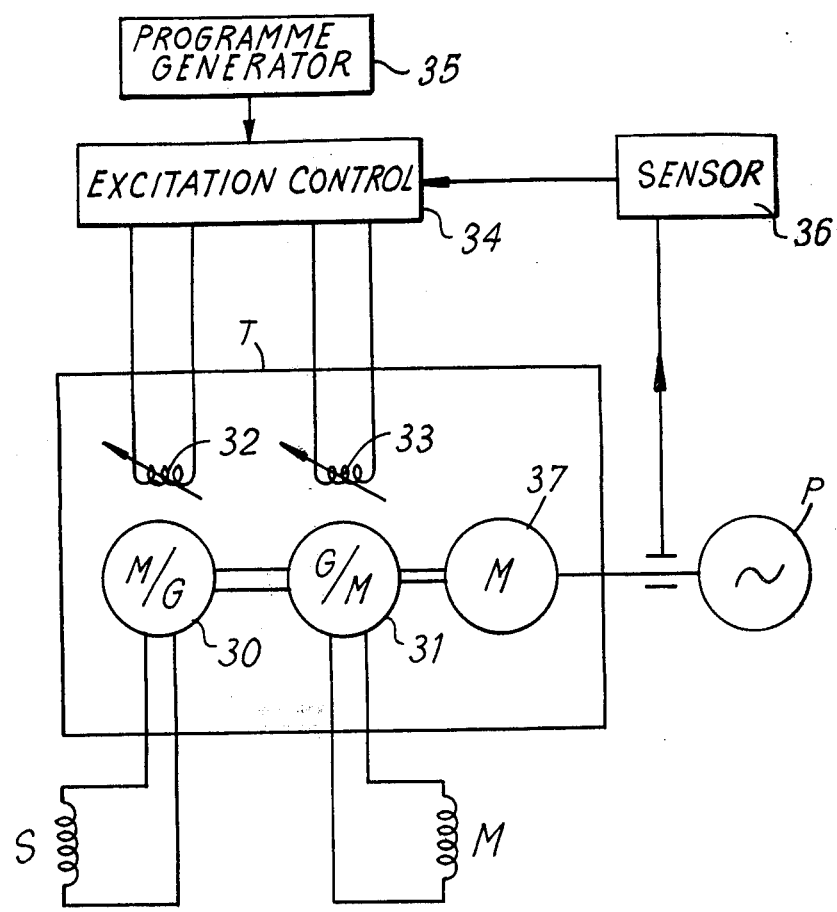
FIG. 6 shows a basic circuit diagram for an alternative form of energy transfer system between two superconducting d.c. coils to that shown in FIG. 1.

A motor/generator 30 has its shaft directly coupled to a motor/generator 31 in the energy transfer means T shown. The main superconducting field coil M is connected to the armature of motor/generator 31 while the storage superconducting field coil S is connected to motor/generator 30, control of the coil parameters during energy transfer being effected by varying the excitation of the machine field windings 32 and 33 respectively, according to the required program, by means of an excitation controller 34 which receives inputs from a program generator 35 and a power sensor 36. Initial excitation of the coil or coils in the system shown is by way of a motor 37 coupled to the motor/generator shafts, motor 37 being, for example, an a.c. machine supplied from a power source P. Should the program generating means for the system shown in FIG. 6 give an insufficiently accurate control of coil parameter variation during energy transfer, a further control may be imposed on the motor/generator field excitation by the sensor 36 in accordance with the condition that minimal direct power flow from source P to the energy transfer means T should occur during an energy transfer operation.

Figure 7:
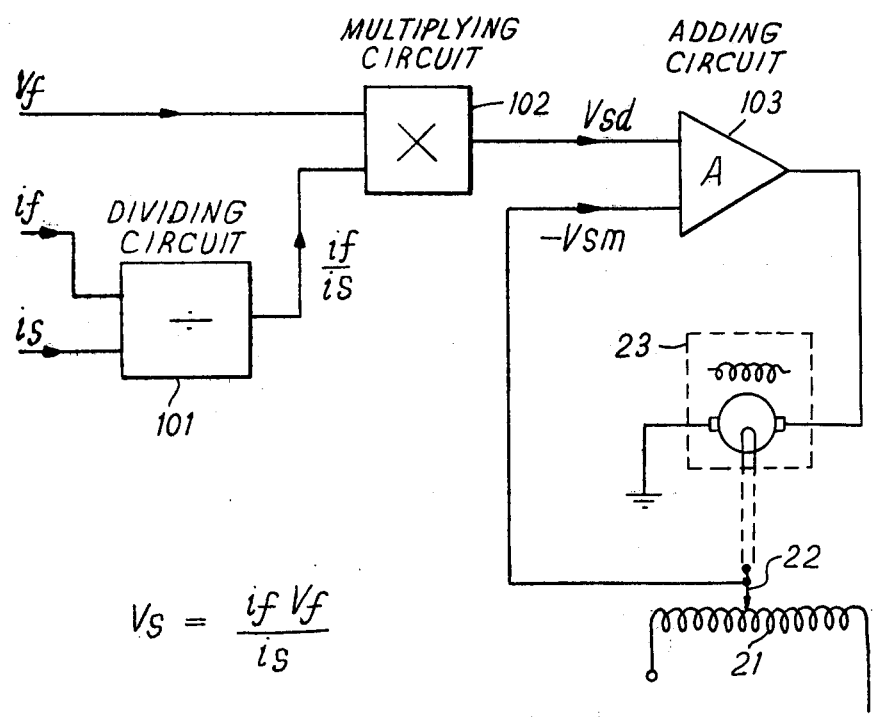
FIG. 7 shows a typical circuit diagram for the controller of FIG. 3 in order to satisfy a program requiring a linear decrease of the generator field coil current.

FIG. 7 illustrates a simple program and control circuit for controller 24. Thus, for the energy transfer case described previously in which the decrease of current in the generator field coil $i_f$ is linear, the expression:

$$i_s v_s = i_f V_f$$

represents a program in accordance with which $v_s$, the instantaneous motor field coil voltage must be controlled by means of moving contact 22 in FIG. 3. Note that:

$$v_f = -L_f \frac{di_f}{dt} = V_f$$

Thus:

$$v_s = \frac{i_f}{i_s} V_f$$

While the program is governed by linear decrease in $i_f$, the parameter initiating the program is $V_f$ which is constant for linear rate of decrease of $i_f$. Prior to initiating the program, $v_f$ is zero, although the generator field coil is at maximum stored energy, because of the superconductive nature of the coils (enabling current flow without voltage drop). On initiating the the program, $V_f$, the maximum value of the generator field coil voltage is demanded and this causes the change in mode of operation of the rectifier/inverter sets to that required for commencement of energy transfer.

FIG. 7 shows the circuitry required (basically a servo mechanism) for the control of contact 22 in accordance with the program. In FIG. 7, the controller contains dividing circuit 101, multiplying circuit 102, and adding circuit 103. Circuits 101, 102 and 103 are conventional. The dividing circuit has two inputs which are connected to signal sources related to $i_f$ and $i_s$ respectively and the output of divider 101 is the quotient $i_f/i_s$. Multiplier circuit 102 has two inputs connected to the program value $V_f$ and the quotient $i_f/i_s$ and multiplies these two values. The output of multiplier 102 is the demanded value $v_{sd}$ of the motor field coil voltage. Thus, value $v_{sd}$ is then compared with the measured value $v_{sm}$ of the motor field coil voltage, and the difference between $v_{sd}$ and $v_{sm}$ is the output of adding circuit 103, and is used to drive motor 23 in a direction to reduce the difference to zero.

Although this invention has been described with respect to preferred embodiments, it should be understood that many variations and modifications will now be obvious to those skilled in the art, and it is preferred, therefore, that the scope of the invention be limited, not by the specific disclosure herein, but only by the appended claims.

We claim:

1. Equipment for transferring energy to or from a direct-current superconducting field coil to change the magnetic field produced by the coil, said equipment comprising a storage coil which is a direct-current superconducting coil generating a magnetic field when energized, energy transfer means interconnecting said field coil and said storage coil, said energy transfer means being electrically controllable to initiate energy transfer between said field coil and said storage coil in either direction and to control the rate of such energy transfer, and electrical control means connected to said transfer means for the electrical control thereof in accordance with a predetermined program whereby to effect a desired transfer of energy between said coils.

2. Equipment as claimed in claim 1 including a power source coupled to the coils by way of the transfer means to provide initial energization of the coils.

3. Equipment as claimed in claim 2 including means for sensing direct power flow between the power source and the transfer means during transfer of energy between the coils, and means for adjusting the energy transfer means under the control of said sensing means to minimize said direct power flow.

4. Equipment as claimed in claim 3 wherein said sensing means is responsive to current flow between the power source and the transfer means and said adjusting means is operative to minimize said current flow.

5. Equipment as claimed in claim 1 in which the current transfer means comprises a transformer coupled by a first rectifier/inverter to the field coil and by a second rectifier/inverter to the storage coil.

6. Equipment as claimed in claim 5 wherein said control means is connected to control the firing angles of the first and second rectifier/inverters.

7. Equipment as claimed in claim 2, in which the transfer means comprises a variable transformer coupled by first and second rectifier/inverters to the field and storage coils respectively and the said control means is connected to control the transformer.

8. Equipment as claimed in claim 7 in which the power source is connected to a primary winding of the said transformer.

9. Equipment as claimed in claim 8 in which first and second secondary windings of said transformer are coupled respectively to the field and storage coils by way of rectifiers separate from the rectifier/inverters to provide power for energization of the coils.

10. Equipment as claimed in claim 8 in which the rectifier/inverters are connected to a single auto-transformer winding of the said variable transformer, one of the rectifier/inverters being connected to the said winding by a moving contact upon which the said control means acts.

11. Equipment as claimed in claim 3 in which the said adjusting means is connected to control the firing angles of two rectifier/inverters coupling the field and storage coils respectively to a variable transformer controlled by the said control means.

12. Equipment as claimed in claim 1 in which the field coil is the field winding of a motor and the storage coil is the field winding of a generator which is drivable by a prime mover and is connected to supply current to the said motor.

* * * * *